(12) United States Patent
Choi et al.

(10) Patent No.: US 10,741,521 B2
(45) Date of Patent: Aug. 11, 2020

(54) SEMICONDUCTOR PACKAGE AND METHOD OF MANUFACTURING SEMICONDUCTOR PACKAGE

(71) Applicant: Magnachip Semiconductor, Ltd., Cheongju-si (KR)

(72) Inventors: Jae Sik Choi, Cheongju-si (KR); Jin Won Jeong, Seoul (KR); Do Young Kim, Goyang-si (KR); Hye Ji Lee, Sejong-si (KR); Byeung Soo Song, Sejong-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 2 days.

(21) Appl. No.: 16/392,388

(22) Filed: Apr. 23, 2019

(65) Prior Publication Data
US 2020/0035644 A1     Jan. 30, 2020

(30) Foreign Application Priority Data
Jul. 26, 2018  (KR) .................. 10-2018-0087297

(51) Int. Cl.
*H01L 23/498* (2006.01)
*H01L 23/00* (2006.01)
*H01L 23/60* (2006.01)

(52) U.S. Cl.
CPC .......... *H01L 24/95* (2013.01); *H01L 23/4985* (2013.01); *H01L 23/49827* (2013.01); *H01L 23/49838* (2013.01); *H01L 23/60* (2013.01); *H01L 24/14* (2013.01); *H01L 24/81* (2013.01)

(58) Field of Classification Search
CPC ......... H01L 23/49827; H01L 23/49838; H01L 23/4985; H01L 23/60; H01L 24/95; H01L 24/81; H01L 24/14
See application file for complete search history.

(56) References Cited

U.S. PATENT DOCUMENTS

| | | | |
|---|---|---|---|
| 2004/0211591 A1* | 10/2004 | Kumakura | .......... H01L 23/5225 174/256 |
| 2005/0208251 A1* | 9/2005 | Aisenbrey | ........ G06K 19/07749 428/40.1 |
| 2008/0023822 A1 | 1/2008 | Lee et al. | |
| 2008/0246165 A1* | 10/2008 | Hess | ....................... H01L 24/40 257/784 |
| 2008/0258290 A1 | 10/2008 | Nakajima | |
| 2012/0273928 A1 | 11/2012 | Kim | |
| 2013/0082367 A1* | 4/2013 | Yoo | ..................... H05K 9/0024 257/659 |
| 2018/0331049 A1 | 11/2018 | Huang et al. | |
| 2019/0287888 A1* | 9/2019 | Koo | ..................... H05K 1/189 |

* cited by examiner

*Primary Examiner* — Douglas M Menz
(74) *Attorney, Agent, or Firm* — NSIP Law

(57) ABSTRACT

A semiconductor package manufacturing method includes preparing a flexible film including input wire patterns and output wire patterns, preparing a semiconductor chip including metal bumps, attaching the semiconductor chip to one side of the flexible film, such that the metal bumps are connected to either one or both of the input wire patterns and the output wire patterns, and attaching a first absorbing and shielding tape to another side of the flexible film, wherein the first absorbing and shielding tape includes an absorption film and a protective insulating film disposed on the absorption film.

15 Claims, 11 Drawing Sheets

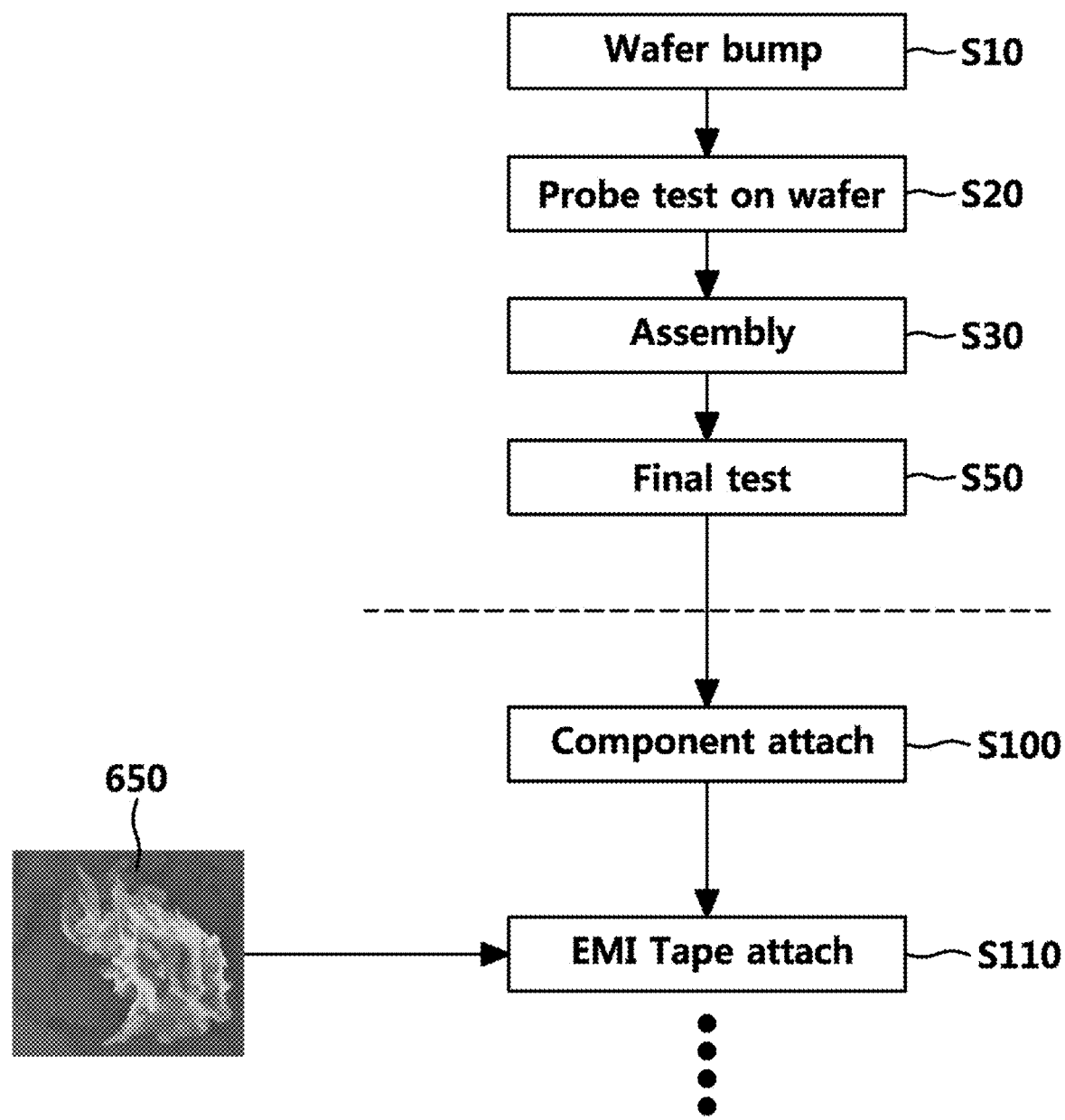

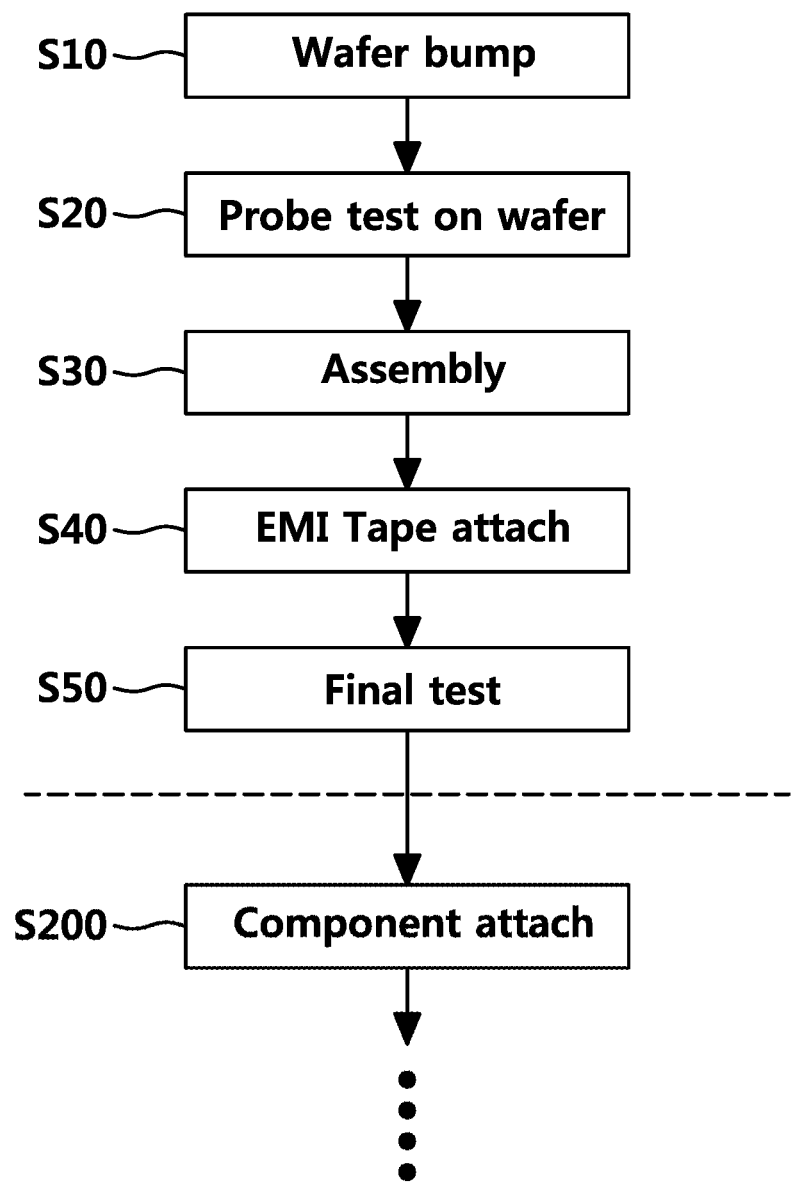

FIG. 14
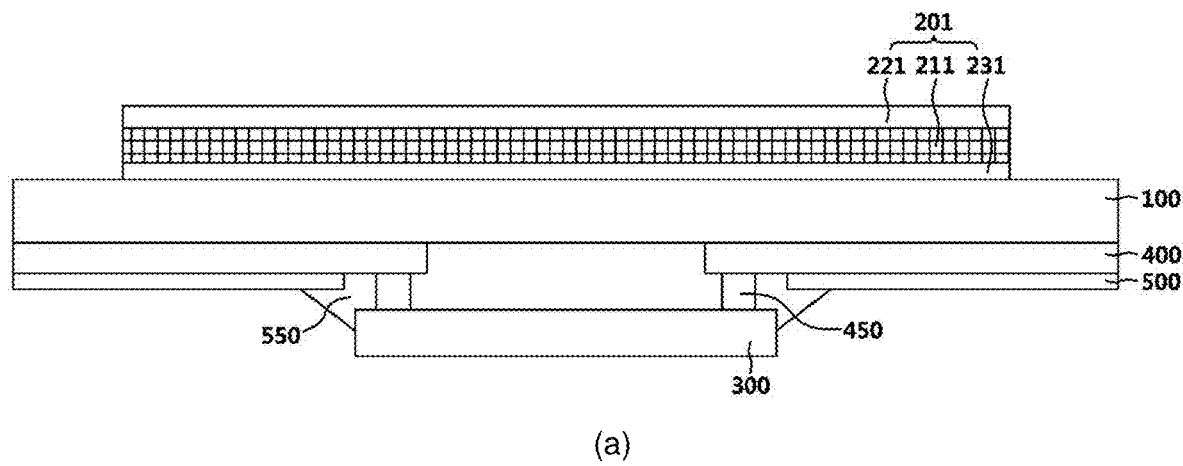
(a)
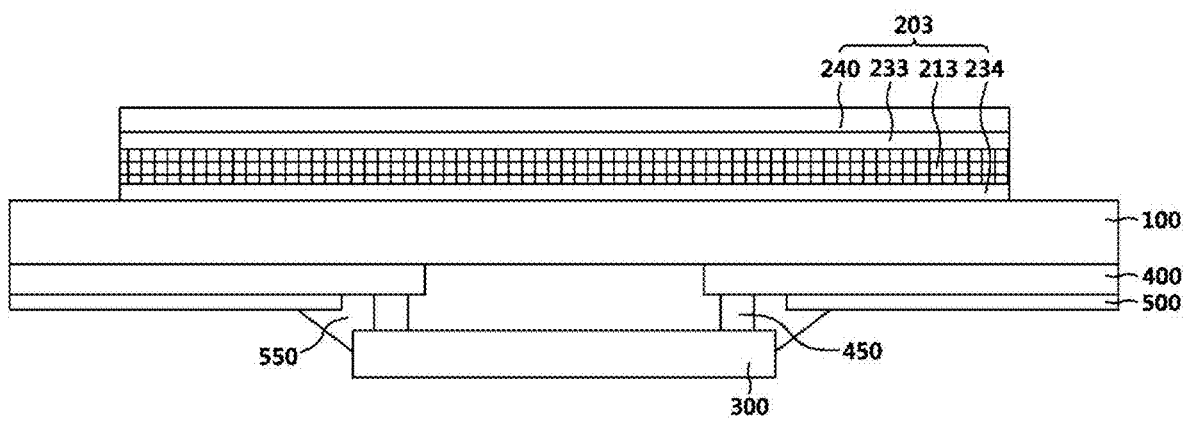
(b)

SEMICONDUCTOR PACKAGE AND METHOD OF MANUFACTURING SEMICONDUCTOR PACKAGE

CROSS-REFERENCE TO RELATED APPLICATIONS

This application claims the benefit under 35 USC 119(a) of Korean Patent Application No. 10-2018-0087297 filed on Jul. 26, 2018 in the Korean Intellectual Property Office, the entire disclosure of which is incorporated herein by reference for all purposes.

BACKGROUND

1. Field

The following description relates to a semiconductor package. The following description also relates to a method of manufacturing a semiconductor package. The following description further relates to a method of manufacturing to a Chip-On-Film (COF) or Chip-On-Plastic (COP) package for shielding electromagnetic waves.

2. Description of Related Art

Recently, mobile terminals such as smartphones or tablets are becoming high-quality devices with high performance characteristics. In order to implement such high performance characteristics, an increasing number of circuit modules are embedded in the mobile terminal, and each circuit module itself is gradually achieving high performance characteristics.

For example, as methods for packaging high-performance circuit modules, there are Tape Carrier Package (TCP), Chip On Glass (COG), Chip On Flexible Printed Circuit (COF), approaches, and other methods for packing high-performance circuit modules in appropriate technologies.

In particular, COF/COP type semiconductor packages pertain to a technique for packaging by mounting a chip on a flexible polyimide film or a thin plastic layer to cope with the trend of thinning and shortening of a semiconductor package. Such a COF/COP type semiconductor package may be used to ensure overall durability for the semiconductor chip mounted on the film, and at the same time, it may be used to shield a noise component generated during the operation of the semiconductor chip. There is an issue that arises, in that if the noise component is not shielded and is instead allowed to directly transmit noise to peripheral devices, the noise may lead to the malfunction of these peripheral devices.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a semiconductor package manufacturing method includes preparing a flexible film including input wire patterns and output wire patterns, preparing a semiconductor chip including metal bumps, attaching the semiconductor chip to one side of the flexible film, such that the metal bumps are connected to either one or both of the input wire patterns and the output wire patterns, and attaching a first absorber and shielding tape to another side of the flexible film, wherein the first absorber and shielding tape includes an absorption film and a protective insulating film disposed on the absorption film.

The first absorber and shielding tape may further include an adhesive layer disposed between the absorption film and the protective insulating film, and the protective insulating film may contact each side surface of the adhesive layer and the absorption film.

The protective insulating film may surround an entire surface of the absorption film.

The absorption film may include a metal alloy including either one or both of iron (Fe) and nickel (Ni), or an Mn—Zn alloy, and the protective insulating film may include either one or both of aluminum (Al) and copper (Cu).

The protective insulating film may include a material including polyethylene terephthalate (PET).

The method may further include attaching a second absorber and shielding tape to a top surface of the semiconductor chip.

The method may further include attaching the semiconductor package to a display panel.

In another general aspect, a semiconductor package includes a flexible film including input wire patterns and output wire patterns, a semiconductor chip disposed on the flexible film, the semiconductor chip including metal bumps connected to either one or both of the input wire patterns and the output wire patterns, a first absorber and shielding tape disposed on the flexible film, and a second absorber and shielding tape disposed on the semiconductor chip, wherein each of the first absorber and shielding tape and the second absorber and shielding tape includes a corresponding absorption film and a protective insulating film formed on the absorption film.

Each protective insulating film may surround an entire surface of the corresponding absorption film.

The semiconductor package may further include an under-fill layer and a metal wire protecting layer, formed between the semiconductor chip and the either one or both of the input wire patterns and the output wire patterns.

In another general aspect, semiconductor package includes a flexible film including input wire patterns and output wire patterns, a semiconductor chip disposed on the flexible film, the semiconductor chip including metal bumps connected to either one or both of the input wire patterns and the output wire patterns, an absorber and shielding tape disposed on an upper side of the flexible film, wherein the absorber and shielding tape includes an absorption film and a protective insulating film formed on the absorption film.

The semiconductor package may further include a first adhesive layer formed on the upper side of the flexible film, wherein the absorption film is formed on the first adhesive layer.

The semiconductor package may further include a second adhesive layer formed on the absorption film, wherein the protective insulating film is formed on the second adhesive layer.

The absorption film may include a metal alloy including either one or both of iron (Fe) and Nickel (Ni), or an Mn—Zn alloy.

The protective insulating film may include a polyethylene terephthalate (PET) film, an aluminum (Al) film, or a copper (Cu) film.

Other features and aspects will be apparent from the following detailed description, the drawings, and the claims.

BRIEF DESCRIPTION OF THE DRAWINGS

FIG. 3 is a flowchart showing a step of attaching an absorber and shielding tape according to an example in a manufacturing process of a display module.

FIG. 4 is a flowchart showing a step of attaching an absorber and shielding tape according to an example in a manufacturing process of a display module.

FIG. 14 shows a semiconductor package according to an example.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
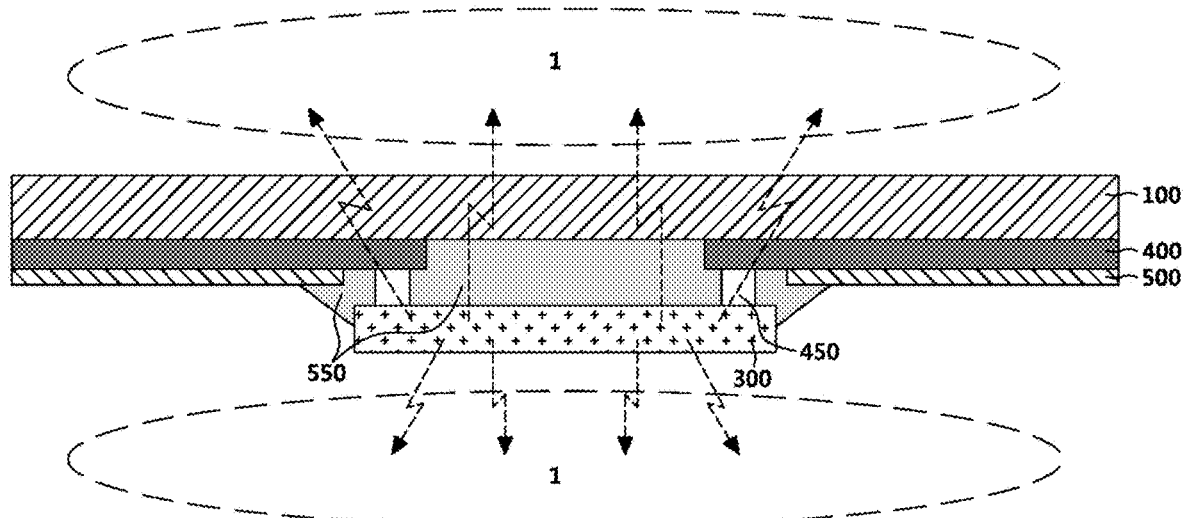
FIG. 1 is a sectional view of an example of a semiconductor package for comparison.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

In this description, a singular expression is used interchangeably with the term "at least one", such that it refers to one or more of elements described.

Herein, it is noted that use of the term "may" with respect to an example or embodiment, e.g., as to what an example or embodiment may include or implement, means that at least one example or embodiment exists where such a feature is included or implemented while all examples and embodiments are not limited thereto.

The term "adjacent" refers to a layer inside a provided filter that is in close proximity to another layer. Adjacent layers may be touchable or may be separated by three or less of intervening layers.

The term "alloy" refers to a composition of two or more metals having distinct physical properties differing from the physical properties of any single metal alone.

The term "in contact with" refers to contacting or sharing at least one common boundary.

The term "electromagnetic interference (EMI) shielding" refers to reflection or absorption of electromagnetic waves by an electrically conductive layer.

The term "shield" refers to absorption, blocking, or reflection of electromagnetic waves.

The details of one or more examples are set forth in the accompanying drawings and the Detailed Description. Other features, objects, and advantages will be apparent from the description and drawings, and from the claims.

The following description is intended to provide an understanding of a method of semiconductor package manufacturing that may be capable of increasing an electromagnetic wave shielding effect and at the same time may barely have and thereby minimize generation of particles escaping from the manufactured semiconductor package.

The present method may also provide for a semiconductor package that is manufactured by the semiconductor package manufacturing method described further herein, so as to have improved emission management.

FIG. 1 is a sectional view of an example of a semiconductor package for comparison.

Referring to the example of FIG. 1, a semiconductor package may have a structure in which a semiconductor chip 300 is disposed in a flexible film 100, and the semiconductor chip 300 may include a metal wiring layer 400, a metal bump 450, a metal wire protecting layer 500, and an under-fill layer 550. The flexible film 100 may be a film with flexibility, such as a polyimide film. However, the flexible film 100 is not limited to a polyimide film, and other flexible materials may be used, as appropriate. In this example, the semiconductor chip 100 may include a display driver integrated circuit (IC).

The metal wiring layer 400 may be a layer where a plurality of wires or leads are formed, and metal leads used for transmitting input and/or output signals of the semiconductor chip 300 may be disposed in the metal wiring layer 400. Each of the metal leads may be connected with each of the channels of a display panel.

The metal bump 450 may be disposed with respect to a face of the semiconductor chip 300, such that the wires or leads and the semiconductor chip 300 are electrically connected together. The metal bump 450 may be a mass of metal material and may be included in various examples as a bump, a solder ball, a through solder via (TSV), and so on. However, in other examples the metal bump may take different forms than those listed, and the metal bump may be formed of various possible metals suitable for forming an electrical connection.

The metal wire protecting layer 500 may be a layer that is present for protecting the metal wire from the outside.

The under-fill layer 550 may fill the space from the bottom of the flexible film 100 to the metal bump 450, the metal wiring layer 400, and the semiconductor chip 300. For example, the under-fill layer 550 may be a polymer insulating material and may cover a portion of an edge of an opening area of the metal wire protecting layer 500 that is near the semiconductor chip 300 and a portion of an edge of an exposed area of the metal wire layer 400. However, the under-fill layer 550 is not limited to being made of such a polymer insulating material, and other materials may be used in various examples, as appropriate. The under-fill layer 550 may stably fix the semiconductor chip 300 to the flexible film 100. For example, for use as the under-fill layer 550, anisotropic non-Conductive Film (ACF), Non-Conductive Paste (NCP), and related materials and approaches may be used in particular examples, but the under-fill layer 550 is not to be taken as being limited to these materials and approaches. Because a short circuit may occur if a conductive material is inserted into a micro pattern, only nonconductive materials are suitable for use in the under-fill layer 550.

The semiconductor chip 300 may drive unit cells, also called pixels or picture elements, of a display panel. When the semiconductor chip 300 operates, a great deal of heat and electromagnetic waves 1 may be released in the operation process. Such heat and electromagnetic waves may affect other elements in such an electronic device, such as by interfering with the functioning of the other elements. Therefore, proper shielding is required to minimize detrimental effects from the electromagnetic waves.

Figure 2:
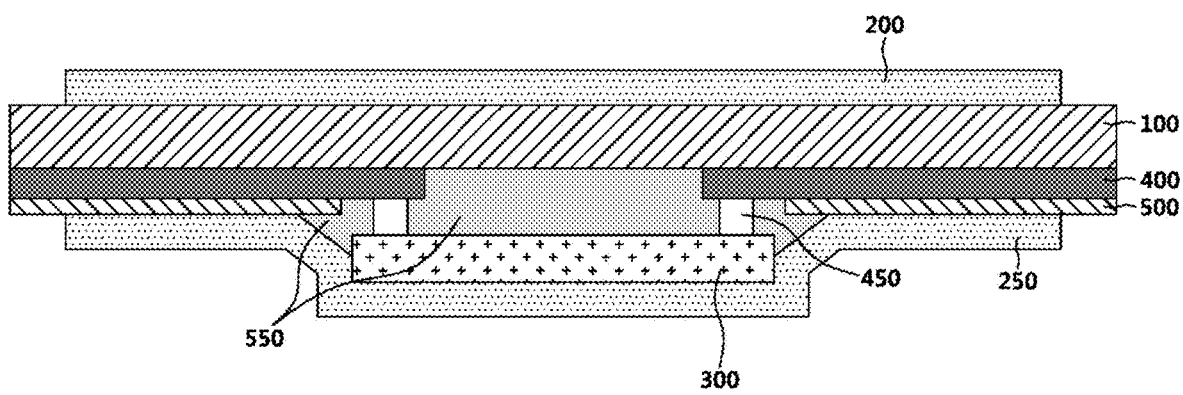
FIG. 2 is a sectional view of a semiconductor package having an electromagnetic shield film according to an example.

FIG. 2 is a sectional view of a semiconductor package having an absorber and shielding tape according to an example.

Referring to the example of FIG. 2, an example of a semiconductor package may include a flexible film 100, a first absorber and shielding tape 200, a semiconductor chip 300, a metal wire layer 400, a metal bump 450, a metal wire protecting layer 500, and an under-fill layer 550.

The first absorber and shielding tape 200 may be disposed on one side of the flexible film 100. The metal wire layer 400 having an opening area may be attached on the other side of the flexible film 100. The metal bump 450 may be connected between the semiconductor chip 300 and the metal wire layer 400. Furthermore, a non-conductive protecting layer 500 may cover a plurality of metal wire layers 400.

The first absorber and shielding tape 200, according to an example, may be provided in the form of a film, a sheet, or other extruded objects filled with a filler material, generally including a material including an EMI absorbing flake as a constituent material. Such an EMI absorbing flake helps absorb electromagnetic radiation to provide the functionality of the first absorber and shielding tape 200.

A wide range of EMI absorbing particles, such as fillers, flakes, and so on, which are also referred to as microwave absorbing particles, fillers, flakes, as so on, may be used in examples. EMI or microwave absorbing particles, fillers, flakes, and so on may be made of various electrically conductive materials and/or magnetic materials.

For example, an iron-based metal alloy, such as an alloy including 85% iron (Fe), 9.5% silicon (Si), and 5.5% aluminum (Al), a nickel-based metal alloy, including 80% nickel (Ni) and 20% iron (Fe), a chrome-based alloy, an iron silicide, iron-chrome compounds, metallic silver, other magnetic alloys, other magnetic powders, appropriate magnetic flakes, or appropriate magnetic particles may be used for the first absorber and shielding tape 200. However, these are only non-limiting examples of materials that may be used for the first absorber and shielding tape 200, and other materials with similar properties may be used in other examples. In this disclosure, a metal alloy containing iron (Fe) or nickel (Ni) is referred to as a soft magnetic material.

The soft magnetic material may have a high magnetic permeability and high permittivity. As another example, a ferrite material, such as a ferrite material including a material such as Ni—Zn, Mn—Zn, and so on, may be used as a soft magnetic metal material. The metal alloy, as discussed above, may be processed into the form of flakes so that the average length of the particle is 10 μm or less.

Other examples may include one or more EMI absorbing particles formed out of one or more of the materials above. The EMI absorbing particles may include any one or any combination of any two or more of granules, spheroids, microspheres, ellipsoids, irregular spheroids, strands, flakes, powdered particles, and/or a combination of such examples of particles, or another, similar type of particle.

By using the first absorber and shielding tape 200, electromagnetic waves released from the semiconductor package during the device operation may be reduced accordingly.

Another example of a semiconductor package may further include a second absorber and shielding tape 250, located on an opposite side of a semiconductor chip 300. That is, the semiconductor package may include a flexible film 100, a first absorber and shielding tape 200, a semiconductor chip 300, a plurality of metal wire layers 400, a metal bump 450, a protecting layer 500, an under-fill layer 550, and the second absorber and shielding tape 250, as discussed above. The second absorber and shielding tape 250 may be made of the same material as the first absorber and shielding tape 200, and a detailed description thereof is omitted for the sake of brevity.

Accordingly, the second absorber and shielding tape 250 may block or absorb electromagnetic waves emitted from the semiconductor package. The second absorber and shielding tape 250 may also block or absorb electromagnetic waves emitted from semiconductor chip 300. By so doing, the second absorber and shielding tape 250 may provide valuable protective characteristics.

FIG. 3 is a flowchart showing a step of attaching an absorber and shielding tape according to an example in a manufacturing process of a display module.

Referring to the example of FIG. 3, a metal bump may be formed in a wafer in operation S10.

The wafer bumping process may be a process of forming a bumper, that is, a bumper made of a metallic material such as gold or silver, on a metal pad of the semiconductor chip 300. However, gold and silver are only example materials, and other metallic materials may be used in other examples. The bumper 450, which is a terminal of the semiconductor chip 300, may be connected to a metal wire layer 400.

Probe testing of the wafer may be performed using the metal bump previously formed in operation S20. In this operation, the probe testing may enable checking whether the semiconductor chip 300 operates properly. For example, in the probe testing, the probe may be directly applied to the metal bump formed in the semiconductor chip.

After the probe testing occurs, semiconductor assembling may be performed in operation S30. Semiconductor assembling refers to placing the semiconductor chip 300 on a flexible film 100, such as a polyimide or a thin flexible plastic film, as discussed further, above. In operation S50, a final test may be performed as to whether the semiconductor chip 300 is successfully connected to the metal wire layer 400.

In operation S100, a semiconductor package may be attached to a display module, for example, a component such as a display panel. That is, the assembled semiconductor package product may be connected to the display panel through bonding, such as anisotropic conductive film (ACF) bonding. ACF bonding is a lead-free and environmentally friendly adhesive interconnect system, in which an anisotropic material, such as a thermosetting resin with conductive particles, is initially deposited on a base substrate, in a variety of possible ways, followed by an optional mounting step, which is then followed by a bonding process that completes the ACF bonding process. In operation S110, the first or second absorber and shielding tape may be attached to the semiconductor package for reflecting and/or absorbing electromagnetic waves.

As a result, electromagnetic waves emitted to the outside of the semiconductor package through the flexible film 100 may be shielded or blocked by the first or second absorber and shielding tape. Furthermore, electromagnetic waves to be emitted to the other side of the semiconductor chip 300 may also be shielded, blocked, and/or absorbed by using the first or second absorber and shielding tape.

During operation S110, a metallic particle or foreign substance 650, illustrated as a scanning electron microscope (SEM) picture in FIG. 3, may emerge. The metallic particles 650 may be produced from the absorber and shielding tape. For example, such particles may be generated by scratching the absorber and shielding tape during operation S110. The metallic particles 650 may cause a secondary problem such as short circuit to occur, should the metallic particles 650 reach an area where their presence leads to the occurrence of such a phenomenon.

In that situation, there may be a problem that both an expensive display panel and semiconductor package may need to be discarded. Also, the production cost may increase sharply, in that some of the display panels and semiconductor packages may be unusable.

FIG. 4 is a flowchart showing a step of attaching an absorber and shielding tape according to an example in a manufacturing process of a display module.

Referring to the example of FIG. 4, in the illustrated method, there are an operation of forming a metal bump in a wafer S10, an operation of testing a probe S20, an operation of assembling S30, an operation of attaching an absorber and shielding tape S40, an operation of final testing S50, and an operation of attaching a display panel S200. For convenience of explanation, differences from FIG. 3 are the focus of the explanation of the example of FIG. 4.

According to the example of FIG. 4, the operation of attaching an absorber and shielding tape S40 may be performed between the assembly operation S30 and the final testing operation S50. However, methods are not to be limited to this particular ordering. As an optional process, the absorber and shielding tape may be attached after the final test step S50. In another example, the step of attaching an absorber and shielding tape S40 may be performed before an operation of attaching a display panel S200.

Even if a metallic foreign substance is generated by the absorber and shielding tape, only the semiconductor package may be discarded. Thus, the production costs for the example of FIG. 4 may be reduced in comparison with the example of FIG. 3, in that there may be less wasted packages. Therefore, performing the step of attaching an absorber and shielding tape before attaching the semiconductor package to a display component, such as a display panel, may be desirable due to such cost reductions.

Figure 5A:
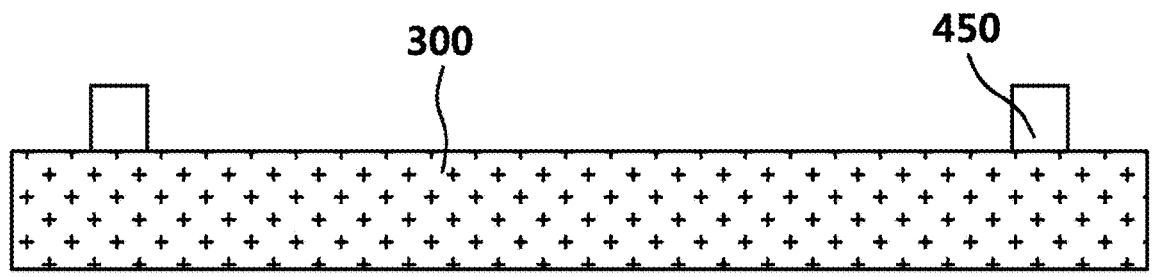
FIGS. 5A to 5C are sectional views of separate steps of manufacturing a display module according to an example.
Figure 5B:
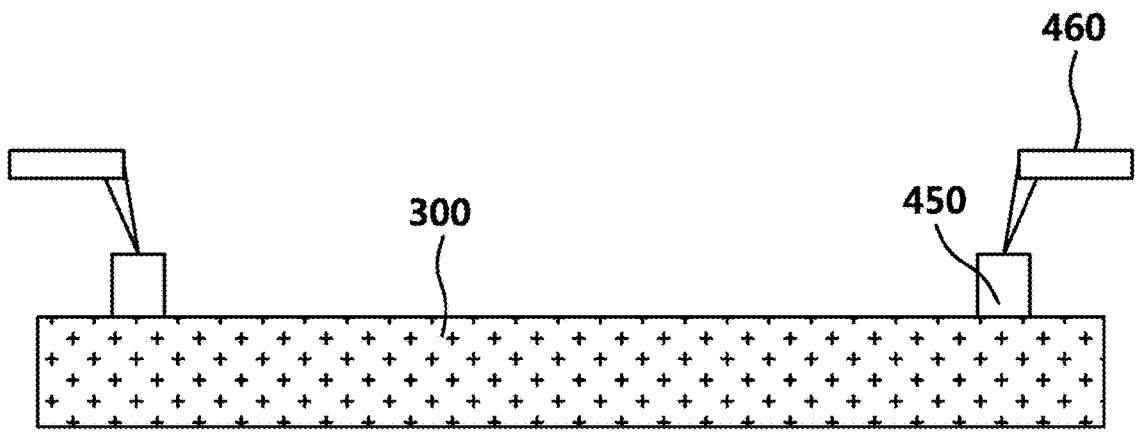
Figure 5C:
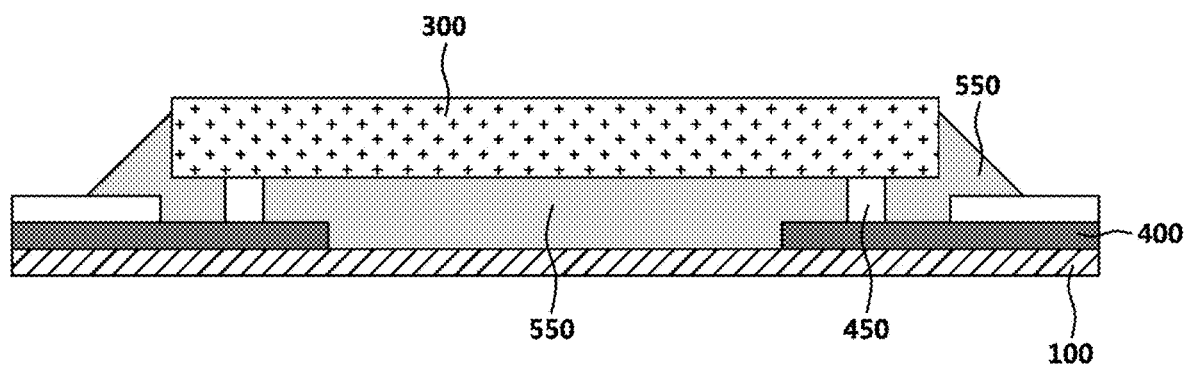

FIGS. 5A to 5C are sectional views of separate steps of manufacturing a display module according to an example.

Referring to the examples of FIG. 3 or 4 and FIG. 5A, for example, a wafer bump process may be performed on the semiconductor chip 300 in operation S10. The semiconductor chip 300 in operation S10 may refer to a display driver IC. As another example, the bump process may be performed after separating chips into individual chips. The bump 450 may be formed in an input/output pad of the semiconductor chip and may have a height of 9 to 15 μm. In an example, the bump 450 may use gold bump technology and may be formed on an input/output pad (I/O) of the display driver IC 300. For example, the input/output pad may be made of aluminum metal. However, the use of gold and aluminum in these examples are only examples, and other metallic materials with similar properties may be substituted, as appropriate. The bump 450 may electrically interconnect between a semiconductor chip 300 and a flexible film 100 or flexible tape 100. The semiconductor package types may be tape carrier package (TCP), chip-on-film (COF), chip on plastic(COP), or chip-on-glass (COG). However, these are only examples of semiconductor package types, and are not to be taken as limiting, in that alternative types of semiconductor packages with similar properties may be used, as appropriate.

Referring to the example of FIG. 5B, a probe test operation S20 may be performed after the bump 450 is formed. The probe test may be performed to check the electrical performance of the semiconductor chip 300. Such a test may enable a verification of whether the semiconductor chip 300 is normal or defective.

Figure 6:
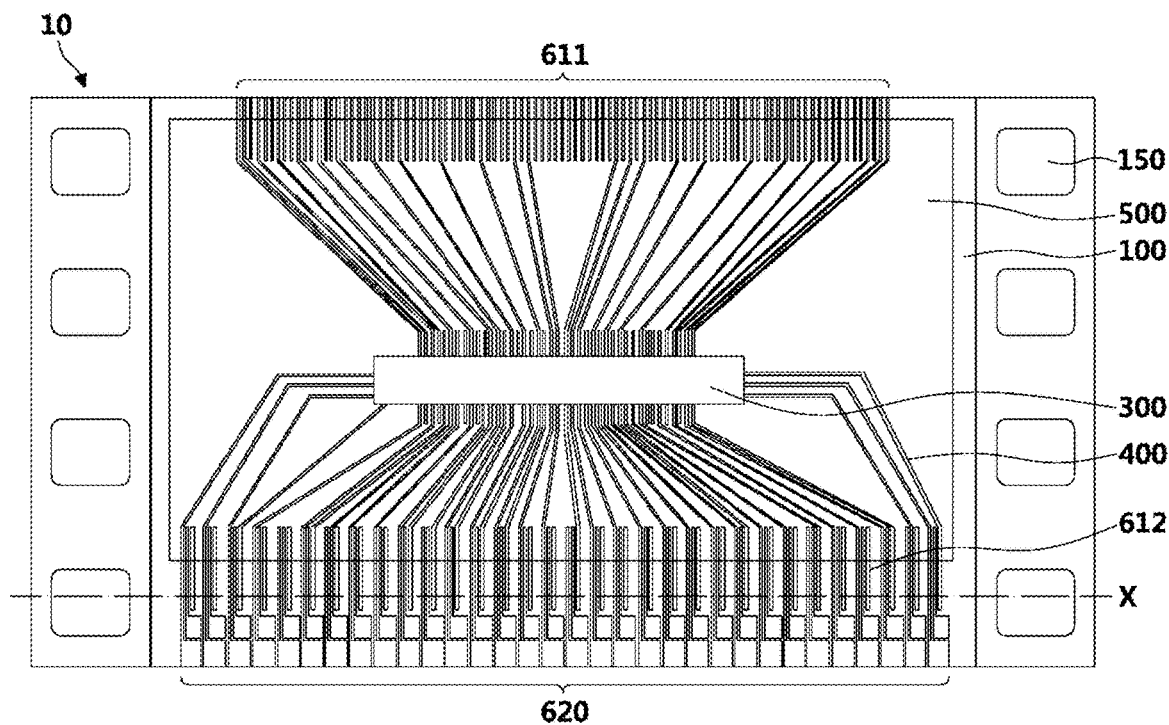
FIG. 6 is a top plan view of a semiconductor package after a particular step of assembling the semiconductor package.

Referring to the example of FIG. 5C, after the probe test is completed, the semiconductor chip 300 may be attached to the flexible film 100 during the assembly process of operation S30. For example, the bump 450 of the semiconductor chip 300 may be connected to the metal wire layer 400 through performing the assembly process. The metal wire layer 400 may have input wire patterns 611 and/or output wire patterns 620, an example of which is illustrated in FIG. 6. Thus, the metal bumps 450 are connected to the input wire patterns 611 and/or the output wire patterns 620, accordingly. Also, the output wire patterns 620 of the metal wire layer may be connected to the display panel. Input wire patterns of the metal wire layer may be connected to a printed circuit board (PCB).

FIG. 6 is a top plan view of a semiconductor package 10 after an operation of assembly S30.

Referring to the example of FIG. 6, a semiconductor chip 10 may include a flexible film 100, a semiconductor chip 300, a plurality of terminals 611, 620, a metal wire layer 400, a first absorber and shielding tape 200 that cover a side of the flexible film 100 that is the back side of the flexible film to which the semiconductor chip is not disposed in FIG. 6, and a metal wire protecting layer 500 covering an exposed portion of the metal wire layer 400. In such an example, the polyimide film may be used for the flexible film 100, though other appropriate types of flexible films 100 may be used, as appropriate, in other examples. The flexible film 100 may further include a plurality of holes 150. The metal wire layer 400 may include a plurality of output wire patterns 620 and input wire patterns 611. Each wire pattern may be made of a metallic material such as copper (Cu), though other appropriate metallic materials may be used, as appropriate, in other examples.

According to another example, the semiconductor chip 10 may further include a second absorber and shielding tape 250 covering the semiconductor chip 300 disposed in the other side of the flexible film 100 and a portion of the metal wire layer 400.

Figure 7:
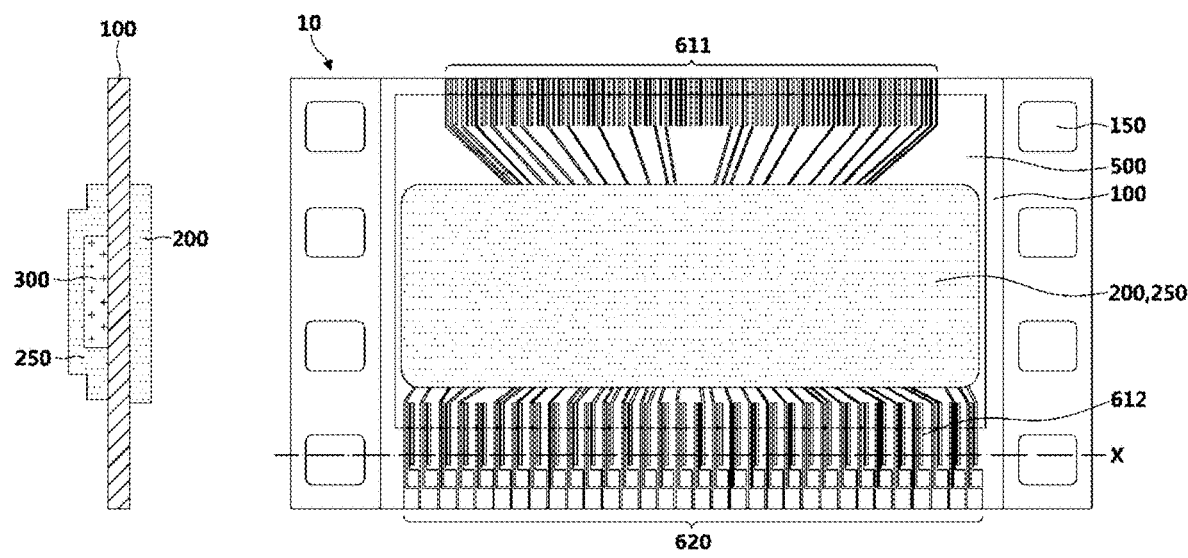
FIG. 7 is a top plan view of a semiconductor package after a step of attaching EMI tape.

FIG. 7 is a top plan view of a semiconductor package after the operation of attaching EMI tape S40.

Referring to the example of FIG. 7 at (a), the first absorber and shielding tape 200 and the second absorber and shielding tape 250 may be attached to the flexible film 100 and the semiconductor chip 300, respectively. The first absorber and shielding tape 200 and/or the second absorber and shielding tape 250 may play a role of an electromagnetic wave absorber and/or electromagnetic reflector. Such an electromagnetic wave absorber may extinguish electromagnetic wave radiation by converting the energy of the electromagnetic wave radiation to heat. The electromagnetic reflector may shield the electromagnetic wave by reflecting noise, directing the undesired radiation away from where it would possibly cause problems.

Referring to FIG. 7 at (a) and FIG. 7 at (b), the first absorber and shielding tape 200 may be attached on one side of the flexible film 100 and may have a larger cross-sectional area than the semiconductor chip 300.

Furthermore, the second absorber and shielding tape 250 may be attached on a semiconductor chip 300 disposed as discussed above, and may have a cross-sectional area much larger than a cross-sectional area of the semiconductor chip 300.

The first absorber and shielding tape 200 and second absorber and shielding tape 250 may be in the form of a film, and may cover the flexible film 100 or the semiconductor chip 300 with a uniform thickness, according to examples. The first absorber and shielding tape 200 and second absorber and shielding tape 250 may include a protective insulating film, for example, protective insulating film 240 in the example of FIG. 12 and the example of FIG. 13, so that metallic particles may not be generated from the first absorber and shielding tape 200 or the second absorber and shielding tape 250.

Figure 8:
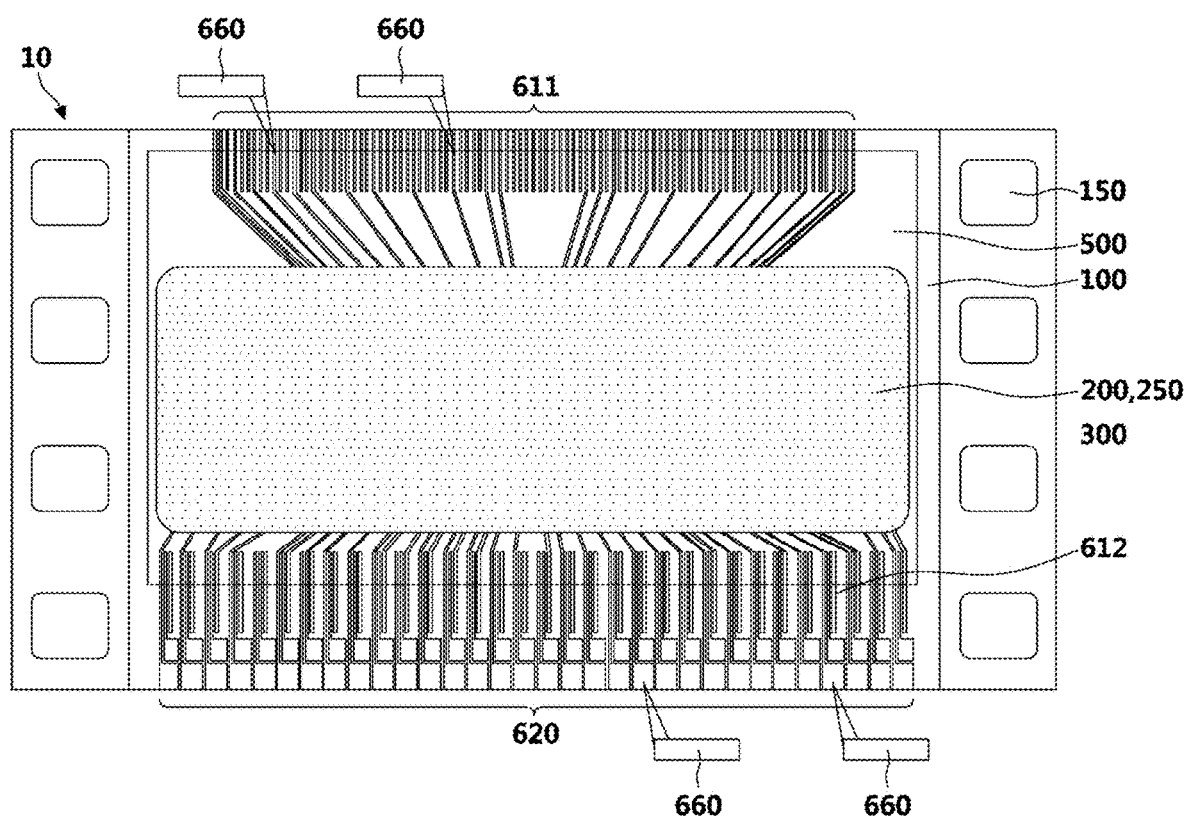
FIG. 8 is a conceptual view of a final test step of an example of a semiconductor package.

FIG. 8 is a conceptual view of a final test step of an example of a semiconductor package.

Referring to the example of FIG. 8, a plurality of terminals 611, 620 may be formed at both ends of the semiconductor package 10. When the final test S50 is finished, the plurality of terminals 620 may be removed.

Figure 9:
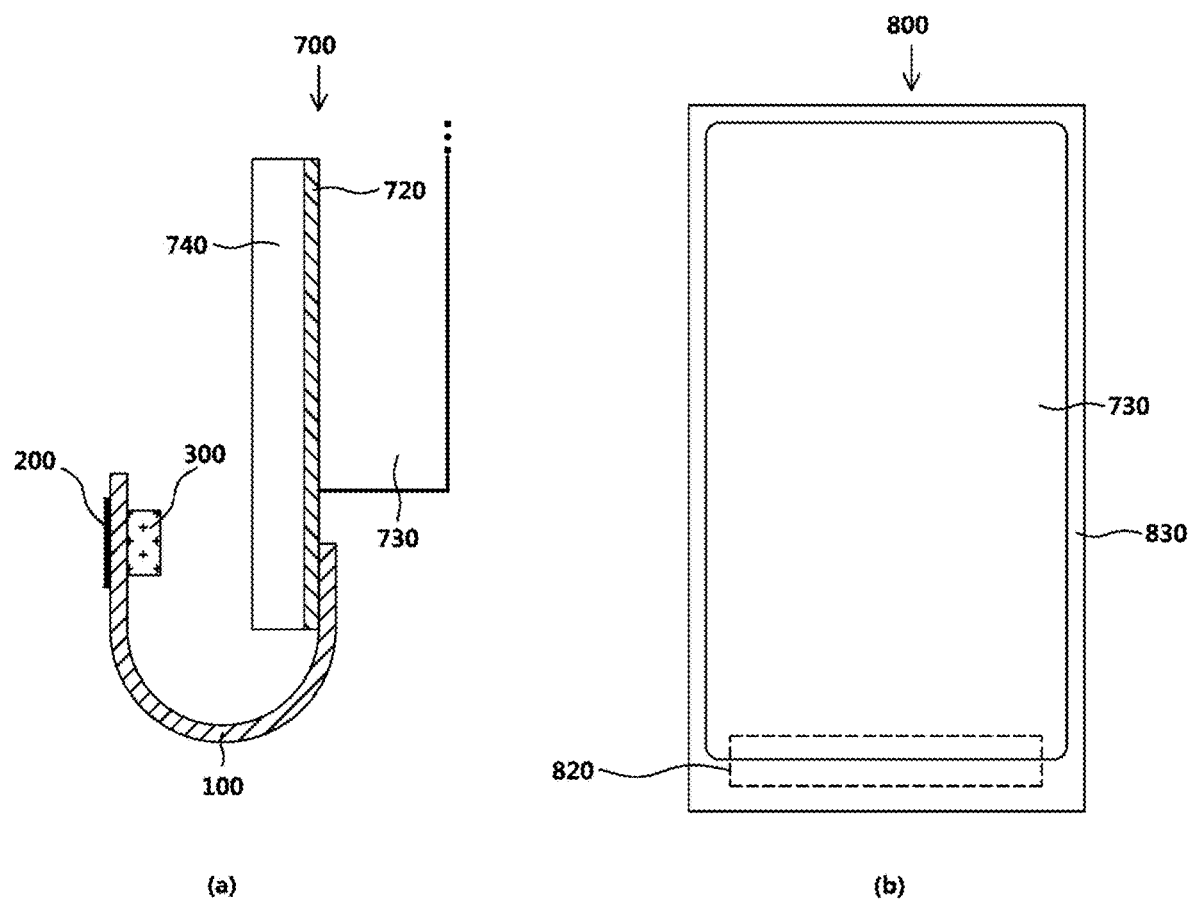
FIG. 9 is a view of a display device to which an example of a semiconductor package is attached.

FIG. 9 is a view of a display device to which an example of a semiconductor package is attached.

The example of FIG. 9 at (a) is a side-sectional view of a display module 700, after the step S200 of attaching a display panel is performed. The first absorber and shielding tape 200 may be formed on one side of the flexible film 100, and the semiconductor chip 300 may be disposed on the other side of the flexible film 100. The display panel 730 may be formed on a first substrate 720. The first substrate 720, which is a region where a metal pad is formed, may be electrically connected to a plurality of terminals 612 or a plurality of output wires 612 of a semiconductor package 10. Such a connection may provide for an electrical interface between these elements.

The display panel 730 may be one of various display panels including an LCD panel, an OLED panel, and so on. However, these are only examples, and the display panel 730 may use another appropriate display panel technology. A touch sensor or other elements may be further disposed in the display panel. The display panel 730 may be disposed at an upper part of a top surface of a panel supporting unit 740, which is a second substrate 740, and the flexible film 100 may have one end disposed and attached at a lower part of the top surface of the panel supporting unit 740. As illustrated in the example of FIG. 9 at (a), the flexible film 100 may be bent toward a back surface of the display panel 730 and the second substrate 740, such that an absorber and shielding tape 200 may be disposed on a surface opposite to a back surface of the second substrate 740 and a semiconductor chip 300 may be disposed on the other surface of the absorber and shielding tape.

The flexible film 100 including a COF-type semiconductor package product completing final test may be connected to a display module 700 through Anisotropic Conductive Film Bonding (ACF) bonding. In such an example, the ACF bonding is an anisotropic conductive film that enables electrical conduction between the display panel and the COF pattern up and down by using an anisotropic conductive film.

The example of FIG. 9 at (b) is a front view of a display device 800 including a display panel 730. The display device 800 may be incorporated into a mobile device such as a smartphone, tablet PC, laptop, and so on. However, these are only examples of mobile devices, and any appropriate electronic device that uses the display device 800 may be used, as appropriate, in an example, as a mobile device. The display device 800 may include a display panel 730 and may include a bezel 830 without a panel. The semiconductor package 10 may be disposed in a region 820 indicated by a dotted line extending across the display panel 730 and the bezel 830.

Figure 10:
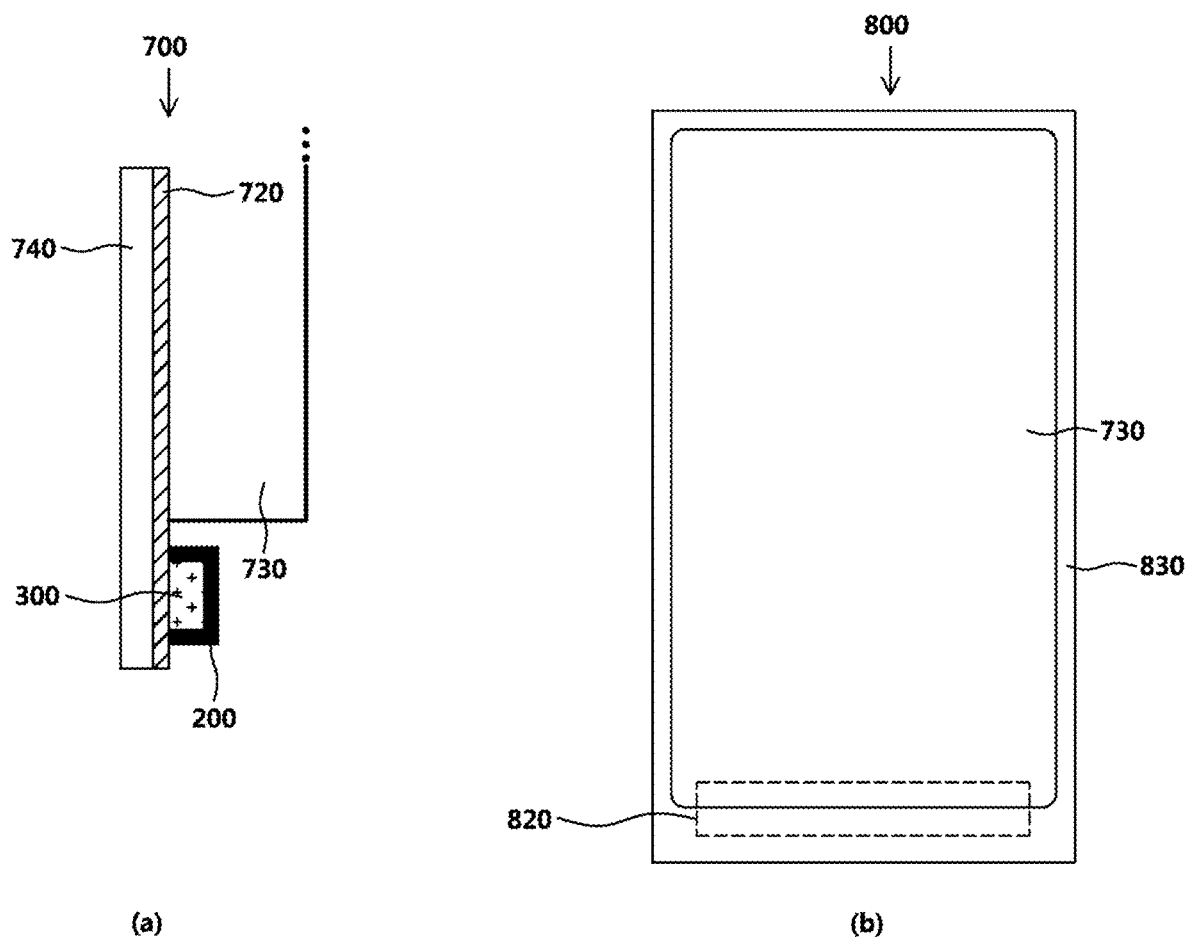
FIG. 10 is a view of a display device to which an example of a semiconductor package is attached.

FIG. 10 shows a display device having an example of a semiconductor package. The display device of the example of FIG. 10 shows a structure in which a semiconductor package 10 may be directly attached on a rigid substrate or a flexible plastic substrate 720, that is, a Chip On Plastic (COP), contrary to the example of FIG. 9. The plastic substrate 720 may be a flexible plastic substrate and may be a film such as polyimide, although various plastics and materials may be used in various examples, as appropriate.

The example of FIG. 10 at (a) is a side-sectional view of a display module 700. A display panel 730 in such an example may be one of various display panels including an LCD panel, an OLED panel, and so on, as discussed above in the example of FIG. 9. A touch sensor and other related elements may be further disposed in the display panel, also as per the discussion in the example of FIG. 9.

An absorber and shielding tape 200 may be disposed in a front surface of a semiconductor chip 300. This approach uses the approach of attaching the semiconductor chip 300, to which the absorber and shielding tape 200 is attached, being directly attached to one side of the plastic substrate 720.

The example of FIG. 10 at (b) is a front view of the display device 800 including the display panel 730. The display device 800 may be a mobile device such as a smartphone, tablet PC, laptop, and so on, as discussed above. The display device 800 may include a flexible substrate 720, a display panel 730 and a bezel 830 without a panel. The semiconductor package 10 may be disposed in a region 820 indicated by a dotted line in FIG. 10 at (b). Accordingly, the semiconductor package 10 may be disposed as extending across the display panel 730 and the bezel 830, overlapping with both the display panel 730 and the bezel 830.

Figure 11A:
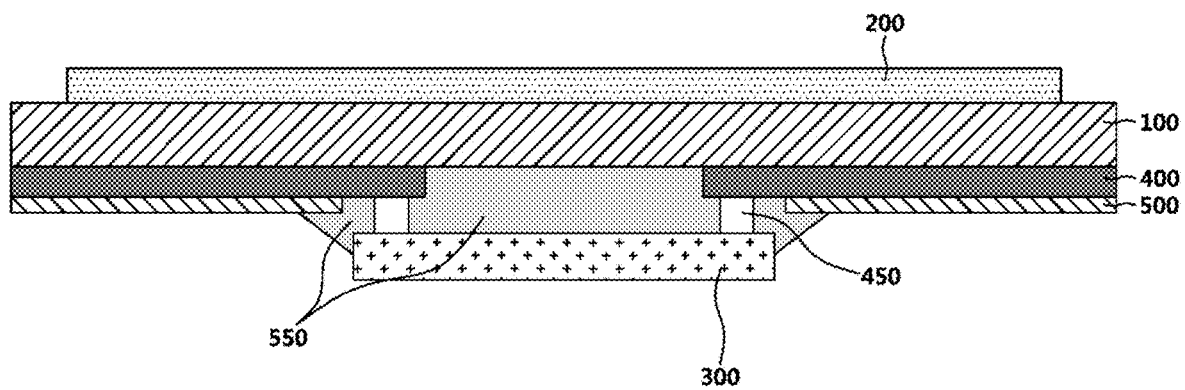
FIGS. 11A to 11C are sectional views of examples of a semiconductor package.
Figure 11B:
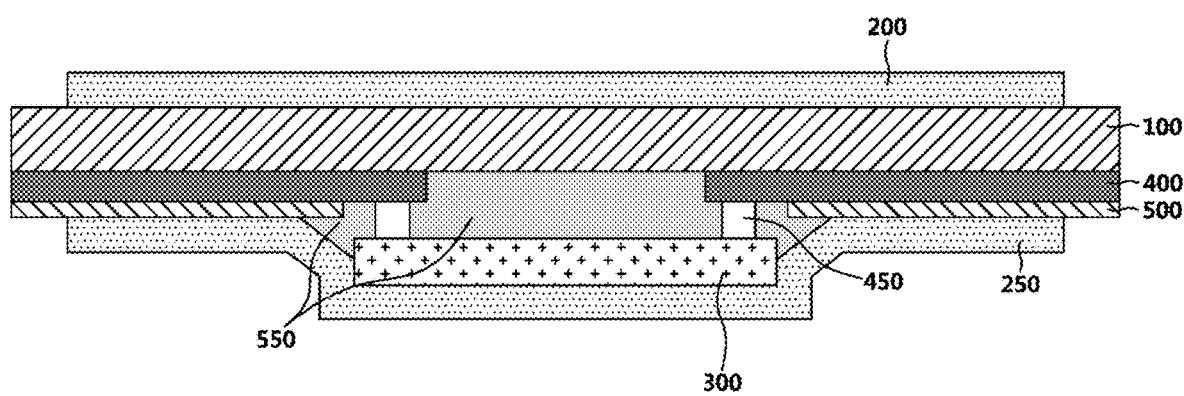
Figure 11C:
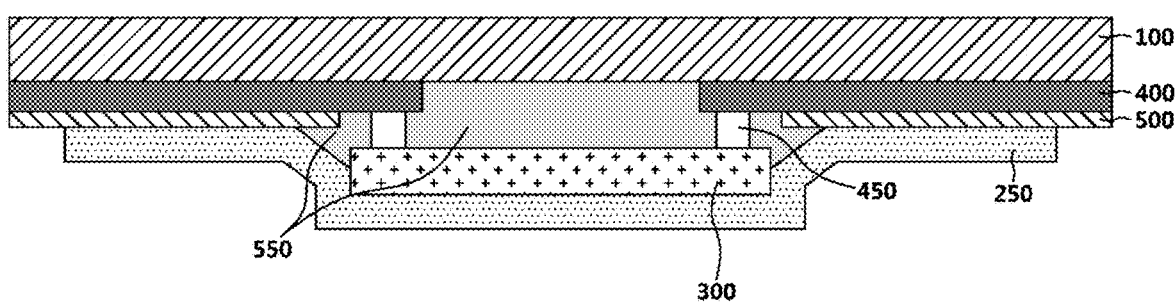

FIGS. 11A to 11C are sectional views of various examples of a semiconductor package.

FIGS. 11A to 11C are sectional views after a first absorber and shielding tape 200 or a second absorber and shielding tape 250 are attached. The first absorber and shielding tape 200 and the second absorber and shielding tape 250 may each function as an absorber and/or a reflector, with respect to electromagnetic waves emitted from the display driver IC. Such absorption and reflection of electromagnetic waves may provide possible advantages in managing the effects of electromagnetic waves that, if not absorbed and/or reflected, would interfere with the functioning of the semiconductor package.

Referring to the example of FIG. 11A, the first absorber and shielding tape 200 may be attached to one side of a flexible film 100 according to an example of a semiconductor package. The semiconductor chip 300, metal wire layer 400, metal bump 450, under-fill layer 550, and metal wire protecting layer 500 may be formed on the other side of the flexible film 100. As a result, electromagnetic wave or heat emitted from the semiconductor chip 300 may be shielded by the first absorber and shielding tape 200.

Referring to the example of FIG. 11B, the first absorber and shielding tape 200 may cover a flexible film 100. Further, the second absorber and shielding tape 250 may be formed on the semiconductor chip 300, the metal wire layer 400 and metal wire protecting layer 500 according to another example of the semiconductor package. As a result, electromagnetic waves and heat emitted from the semiconductor chip 300 may be shielded in the context of this example.

Referring to the example of FIG. 11C, the second absorber and shielding tape 250 may be formed on the semiconductor chip 300, the metal wire layer 400 and metal wire protecting layer 500, but the first absorber and shielding tape 200 is absent. As a result, electromagnetic waves and heat directly generated from the semiconductor chip 300 may be shielded in the context of this example.

Figure 12:
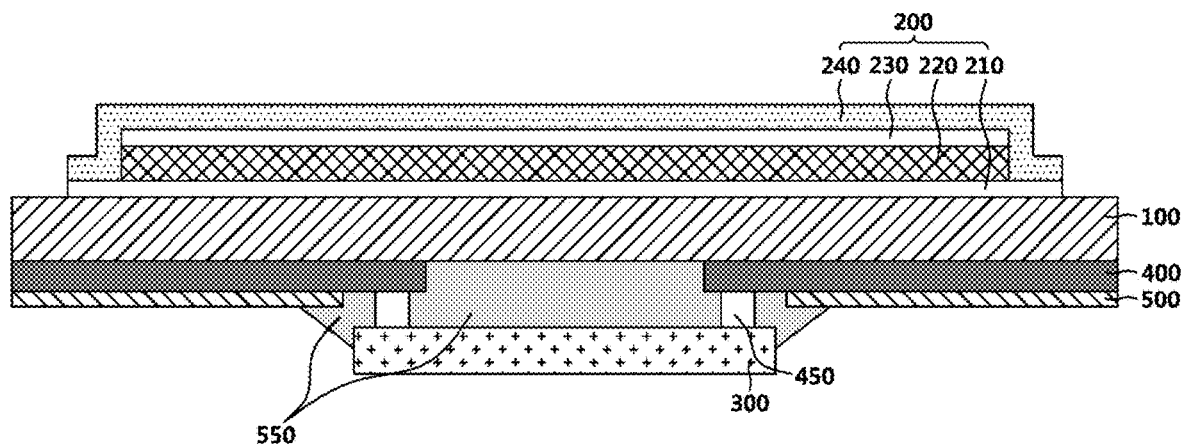
FIG. 12 is a sectional view of an example of a semiconductor package.

FIG. 12 is a sectional view of an example of a semiconductor package.

Referring to the example of FIG. 12, in a semiconductor package 10, an absorber and shielding tape 200 may be disposed on the upper side of a flexible film 100. The absorber and shielding tape 200 may include a first adhesive layer 210 that is near an upper side of the flexible film 100, an absorption film 220, a second adhesive layer 230, and a protective insulating film 240. The first adhesive layer 210 may be formed on an upper side of a flexible film 100. The absorption film 220 may be formed on the first adhesive layer 210. The second adhesive layer 230 may be formed on the absorption film 220.

In such an example, the absorption film 220 may include a metal alloy containing iron (Fe) or nickel (Ni), or a similar metal, which is referred to as a soft magnetic material. Due to including iron or nickel, or similar metal, in the alloy, the absorption film 220 may have a high magnetic permeability and high permittivity. For example, ferrite materials, such as a Ni—Zn alloy, a Mn—Zn alloy, and so on, may be used as the absorption film 220. The metal alloy of the absorption film 220 may be processed into the form of flakes so that the average length of the particles may be 10 µm or less.

The protective insulating film 240 may be formed on the second adhesive layer 230 and the protective insulating film 240 also may cover a side surface of each of the absorption film 220 and the second adhesive layer 230. The protective insulating film 240 may be in direct contact with the first adhesive layer 210. The protective insulating film 240 may prevent particles of the absorber and shielding tape 200 from emerging from the area in which they are intended to be located. For example, the protective insulating film 240 may be made of polyethylene terephthalate (PET) film. As another example, the protective insulating film 240 may be a metallic material, such as aluminum (Al), copper (Cu), or another appropriate metallic material. When a copper (Cu) layer is used for the protective insulating film 240, heat generated from IC or chip may be released more effectively due to the thermal properties of copper.

The absorption film 220 may have a width less than a width of the flexible film 100, and one side of the absorption film 220 may be adjacent to the flexible film 100 and the other side of the absorption film 220 may be adjacent to the protective insulating film 240.

The first and second adhesive layers 210, 230 may be resin-based or acrylic-based adhesives. Resin-based or acrylic-based adhesives may be appropriate materials for use as the first and second adhesive layers because the first or second adhesive layer may be a material that can respond to the thermal expansion of dissimilar materials between the protective insulating film 240 and the absorption film 220, and resin-based or acrylic-based adhesives may exhibit these properties.

The absorption film or electromagnetic wave absorbing layer 220 has a thickness of about 10 um or less, and may be a polymer material. For example, the absorption film or electromagnetic wave absorbing layer 220 may be a polymer material including polyethylene terephthalate (PET). The absorption film 220 may be formed by plasma vapor deposition, electrolytic or chemical plating, electroless or electrolytic metal deposition using a catalyst material, and so on according to various examples and the nature of the absorption film or electromagnetic wave absorbing layer 220 to be deposited. The thickness of the electromagnetic wave absorbing layer 220 may vary depending on the specific application of the semiconductor package.

According to the example of the semiconductor package, the absorption film 220 may be protected by the protective insulating film 240, thereby reducing particles that may be generated during the attaching process. The absorption film 220 may absorb and/or shield the heat or noise generated by the chip.

Figure 13:
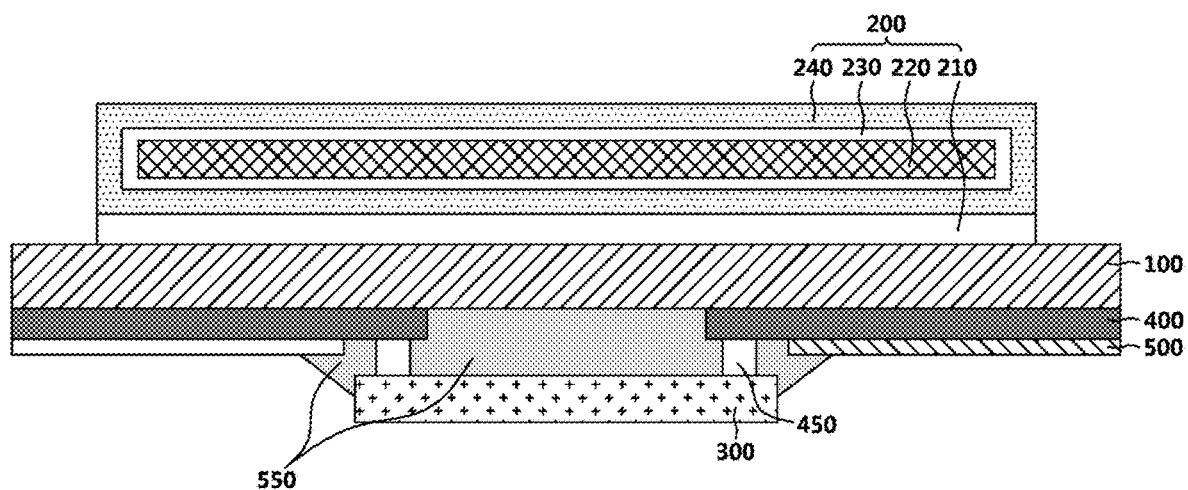
FIG. 13 is a sectional view of an example of a semiconductor package.

FIG. 13 is a sectional view of an example of a semiconductor package.

Referring to the example of FIG. 13, an absorber and shielding tape 200 may be disposed in one side of an insulating flexible film 100. The absorption film 220 may include a first adhesive layer 210, an absorption film 220, a second adhesive layer 230 and a protective insulating film 240.

Contrary to the example of FIG. 12, in the example of the semiconductor package of FIG. 13, one side of the first adhesive layer 210 may be in contact with a portion of outer surface of the protective insulating film 240, and the other side of the first adhesive layer 210 may be in contact with one side of the insulating flexible film 100. The second adhesive layer 230 and the protective insulating film 240 may be disposed to surround the entire surface of the absorption film 220. The remaining features may be the same as the description of the example of FIG. 12.

The first and second adhesive layers 210, 230 may be resin-based or acrylic adhesives, as discussed further, above. As discussed above, the first and second adhesive layers 210 are not limited to being resin-based or acrylic adhesives, but such adhesives are appropriate because the first or second adhesive layer may be a material that can respond to the thermal expansion of dissimilar materials between the protective insulating film 240 and the absorption film 220.

FIG. 14 at (a) shows a semiconductor package according to an example.

In FIG. 14 at (a), placement of the chip 300, the patterned metal layer 400, the surface protective insulating film 500, and the like on the bottom surface of the insulating substrate 100 may be the same as that shown in corresponding elements of the example of FIG. 12. For convenience of explanation, differences from the example of FIG. 12 are described, and similar aspects are omitted, for brevity. In the semiconductor package 10, the absorber and shielding tape 201 may be disposed adjacent to the upper surface of the flexible insulating substrate 100. The absorber and shielding tape 201 may be disposed on the upper surface of the insulating substrate 100 by the adhesive layer 231 including the absorber 211 and the protective insulating film 221 adjacent to the upper surface of the insulating substrate.

According to an example, the absorber 211 may have a width shorter than a width of the insulating substrate 100, and a surface of the absorber 211 may face the insulating substrate 100. The protective insulating film 221 may be the same width as the absorber 211 and may have a width shorter than that of the insulating substrate 100, so as to be adjacent to the upper surface of the insulating substrate 100 without covering the other surface and both sides of the absorber 211, respectively. One surface of the adhesive layer 231 may be disposed to be in contact with one surface of the absorber 210, and the other surface of the adhesive layer 231 may be disposed to be in contact with an upper surface of the insulating substrate 100.

FIG. 14 at (b) shows a semiconductor package according to an example.

In FIG. 14 at (b), placement of the chip 300, the patterned metal layer 400, the surface protective insulating film 500, and the other related elements on the bottom surface of the insulating substrate 100 may be the same as that shown in the example of FIG. 12. For convenience of explanation, differences from the example of FIG. 12 are described, and similar material is omitted for brevity.

In FIG. 14 at (b), the absorbing tape 203 may be disposed on the upper surface of the flexible insulating substrate 100. The absorber and shielding tape 203 may be disposed on the upper surface of the insulating substrate 100, attached by the adhesive layers 233 and 234, and may include the absorber 213 and the protective insulating film 240 adjacent to the upper surface of the insulating substrate.

According to an example, the absorber 223 may have a width shorter than the width of the insulating substrate 100, and a surface of the absorber 223 may be adjacent to the insulating substrate 100. The protective insulating film 240 may be the same width as the absorber 223 and may have a width shorter than a width of the insulating substrate 100. The protective insulating film 240 may be disposed adjacent to the other surface of the absorber, without covering the other surface and both side surfaces of the absorber 213.

In the example of FIG. 14 at (b), the protective insulating film 240 is a heat dissipation material, unlike the examples of FIGS. 12 and 13, that shields and reflects external heat from an outside environment to prevent the external heat from entering the semiconductor package. The protective insulating film 240 may be a metallic material such as aluminum (Al) or copper (Cu). However, these are only example metallic materials, and other metallic materials with similar physical properties may be used in other examples.

One surface of the first adhesive layer 233 is disposed in contact with the other surface of the absorber 213 and the other surface of the first adhesive layer 233 is disposed in contact with the lower surface of the protective insulating film 240. At this time, the first adhesive layer may be a material that can adapt to the thermal expansion of dissimilar materials between the protective insulating film and the absorber. One side of the second adhesive layer 234 may be disposed in contact with one surface of the absorber 213 and the other side of the second adhesive layer 234 may be disposed in contact with the upper surface of the insulating substrate 100. For example, the second adhesive layer 234 may be an acrylic adhesive layer, though other types of adhesive layer with similar physical properties may be used in other examples. As a result, the semiconductor package according to the examples may be able to effectively release heat generated from the chip.

According to the semiconductor package of the examples described above, an absorber and shielding tape is protected by a protection layer, thereby reducing the particles from escaping that may otherwise occur in the process.

According to the semiconductor package of the examples described above, heat generated from a chip may be released effectively.

According to the semiconductor package of the examples described above, the attachment of an absorber and shielding tape in COF/COP/COG assembly processes may reduce a defect rate that may otherwise occur when the semiconductor package is connected to a display panel.

According to the semiconductor package of the examples described above, the production cost may be reduced in accordance in keeping with the reduction of the defect rate by attaching the absorber and shielding tape in the COF/COP/COG assembly process, because the expense that would otherwise occur due to defective products may be minimized.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor package manufacturing method comprising:
    preparing a flexible film comprising input wire patterns and output wire patterns;
    preparing a semiconductor chip comprising metal bumps;
    attaching the semiconductor chip to one side of the flexible film, such that the metal bumps are connected to either one or both of the input wire patterns and the output wire patterns; and
    attaching a first absorber and shielding tape to another side of the flexible film,
    wherein the first absorber and shielding tape comprises an absorption film and a protective insulating film disposed on the absorption film.

2. The method of claim 1,
    wherein the first absorber and shielding tape further comprises an adhesive layer disposed between the absorption film and the protective insulating film, and
    wherein the protective insulating film contacts each side surface of the adhesive layer and the absorption film.

3. The method of claim 1, wherein the protective insulating film surrounds an entire surface of the absorption film.

4. The method of claim 1, wherein the absorption film comprises a metal alloy comprising either one or both of iron (Fe) and nickel (Ni), and the protective insulating film comprises copper (Cu).

5. The method of claim 1, wherein the protective insulating film comprises a material comprising polyethylene terephthalate (PET).

6. The method of claim 1, further comprising attaching a second absorber and shielding tape to a top surface of the semiconductor chip.

7. The method of claim 1, further comprising attaching the semiconductor package to a display panel.

8. A semiconductor package comprising:
    a flexible film comprising input wire patterns and output wire patterns;
    a semiconductor chip disposed on the flexible film, the semiconductor chip comprising metal bumps connected to either one or both of the input wire patterns and the output wire patterns;
    a first absorber and shielding tape disposed on the flexible film; and
    a second absorber and shielding tape disposed on the semiconductor chip,
    wherein each of the first absorber and shielding tape and the second absorber and shielding tape comprises a corresponding absorption film and a protective insulating film formed on the absorption film.

9. The semiconductor package of claim 8, wherein each protective insulating film surrounds an entire surface of the corresponding absorption film.

10. The semiconductor package of claim 8, further comprising an under-fill layer and a metal wire protecting layer, formed between the semiconductor chip and the either one or both of the input wire patterns and the output wire patterns.

11. A semiconductor package comprising:
    a flexible film comprising input wire patterns and output wire patterns;
    a semiconductor chip disposed on the flexible film, the semiconductor chip comprising metal bumps connected to either one or both of the input wire patterns and the output wire patterns;
    an absorber and shielding tape disposed on an upper side of the flexible film,
    wherein the absorber and shielding tape comprises an absorption film and a protective insulating film formed on the absorption film.

12. The semiconductor package of claim 11, further comprising a first adhesive layer formed on the upper side of the flexible film, wherein the absorption film is formed on the first adhesive layer.

13. The semiconductor package of claim 12, further comprising a second adhesive layer formed on the absorption film, wherein the protective insulating film is formed on the second adhesive layer.

14. The semiconductor package of claim 11, wherein the absorption film comprises a metal alloy comprising either one or both of iron (Fe) and Nickel (Ni), or an Mn—Zn alloy.

15. The semiconductor package of claim 11, wherein the protective insulating film comprises a polyethylene terephthalate (PET) film, an aluminum (Al) film, or a copper (Cu) film.

* * * * *